Dec. 10, 1968 P. KOROL ET AL 3,415,218

CHANNEL INDICATOR FOR TELEVISION RECEIVER

Filed Jan. 27, 1965

INVENTORS:
PETER KOROL,
ROBERT J. WALLIS,

BY William S. Wolfe
THEIR ATTORNEY.

United States Patent Office 3,415,218
Patented Dec. 10, 1968

3,415,218
CHANNEL INDICATOR FOR TELEVISION RECEIVER

Peter Korol, De Witt, and Robert J. Wallis, Syracuse, N.Y., assignors to General Electric Company, a corporation of New York Filed Jan. 27, 1965, Ser. No. 428,451
4 Claims. (Cl. 116—124.4)

ABSTRACT OF THE DISCLOSURE

In a combination UHF and VHF channel selector and indicator apparatus, VHF and UHF channel selector shafts extend through an apertured light emitting panel and are terminated by UHF tuning and VHF selector discs. The VHF selector disc is substantially transparent and is separated from the light emitting panel by a translucent fine tuning disc which allows light to pass from the panel to illuminate indicia on the VHF selector disc. The UHF tuning disc is transparent with a separate translucent indicator disc mounted between the UHF tuning disc and the light emitting panel for providing illumination of the indicia on the indicator disc.

The present invention relates to channel indicators for television receivers, and more specifically toward an illuminated UHF and VHF channel indicator.

The conventional VHF tuner employed in television receivers includes a channel selector shaft and a fine tuning sleeve concentric with and surrounding the channel selector shaft. Similarly, the conventional UHF converter includes a tuning shaft and a sleeve concentric with and surrounding the tuning shaft and driven at a planetary speed with respect thereto.

It is desirable in a television receiver employing such a VHF tuner and UHF converter to provide an illuminated indication of the particular channel selected.

In the past, attempts have been made to provide an illuminated indication of the UHF and VHF channel selection. However, the prior art approaches have not been completely satisfactory. In this regard, many of the prior art devices were completely incompatible with the above-described UHF tuner and VHF converter where, in both instances, mechanical coupling must be effected to a sleeve surrounding a shaft as well as to the shaft itself. Further, those devices that were compatible with such a tuner and converter were relatively complex and expensive, such devices being intended for use only in the more expensive television receivers. Yet further, the prior art illuminated indicator devices generally require structure in addition to that required for the corresponding non-illuminated system. Thus, illuminated indicating devices of this type were not easily interchangable with non-illuminated devices and vice-versa, which capability should exist for a low cost device because of mass production considerations. Even further, many of the prior art devices did not provide an easily viewed and pleasing channel indication.

Accordingly, an object of the invention is to provide an illuminated UHF and VHF channel indicator for a elevision receiver.

Another object is to provide a simplified and inexpensive illuminated UHF and VHF channel indicator for a television receiver.

Yet another object is to provide an illuminated UHF and VHF indicator which is easily interchangable with a non-illuminated device and vice-versa.

Yet another object is to provide an illuminated UHF and VHF indicator which is easily interchangable with a non-illuminated device and vice-versa.

Still another object is to provide an illuminated UHF and VHF channel indicator whereby a pleasing and easily visible channel indication is provided.

These and other objects are achieved in one embodiment of the invention through the use of the generally disc shaped members conventionally employed for the tuning of the UHF converter and VHF tuner in a non-illuminated system as the elements of the illuminated indicating device thereby eliminating the necessity of additional elements such as projection screens, or projection windows.

In accordance with the invention, a VHF channel selector disc is provided for selecting the desired channel, the disc being formed from a transparent material and having transparent channel representing indicia formed thereon against an opaque background. A VHF fine tuning disc is attached to the fine tuning sleeve and shaft to allow for fine tuning, the fine tuning disc being interposed between the VHF tuner and the VHF channel selector disc and being formed from a translucent material to thereby serve as an illuminated screen behind the transparent indicia. An aperture is provided in the metal overlay conventionally utilized on the front of the receiver to allow passage of light from a lamp through the translucent fine tuning disc to illuminate the transparent indicia which corresponds to the selected channel.

Similarly, a UHF tuning disc affixed to the UHF tuning shaft for the purpose of tuning the UHF converter is formed from a transparent material. A UHF indicator disc is affixed to the UHF converter sleeve and is interposed between the UHF tuning disc and the converter, the UHF indicator disc being formed from a translucent material and having channel representing indicia formed thereon against an opaque background. A second aperture is provided in the metal overlay behind which is positioned a second lamp. In this manner, light is directed through the translucent UHF indicator disc which serves as an illuminated screen for the transparent indicia which are viewed through the transparent UHF tuning disc.

A switch coupled to the VHF channel selector shaft is utilized to energize the second lamp when the channel selector shaft is in the UHF position, the second lamp being unenergized in all other VHF selector shaft positions.

The novel and distinctive features of the invention are set forth in the appended claims. The invention itself, together with further objects and advantages thereof, may best be understood by reference to the following description and accompanying drawings in which:

Figure 1:
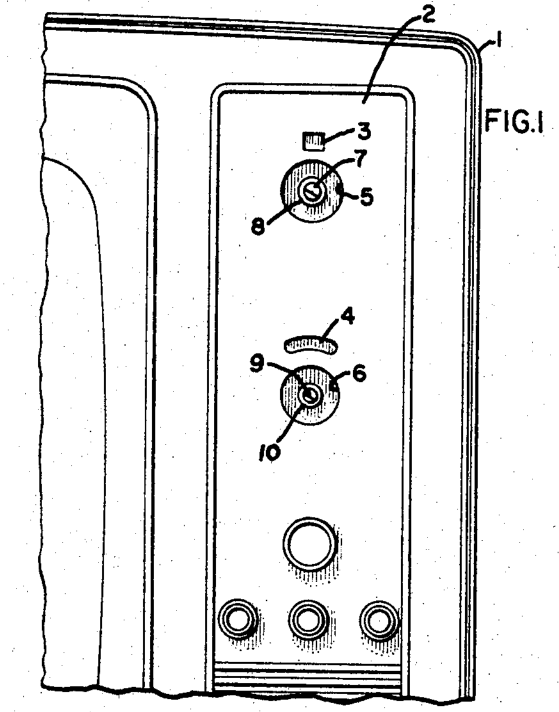
FIGURE 1 is a partial front view of a television receiver cabinet in accordance with the invention with the UHF and VHF tuning controls removed.

Referring to FIGURE 1, there is shown a partial front view of a representative television receiver cabinet 1. In accordance with the invention, a metal overlay 2 which is conventionally utilized in television receivers, is provided with a first light transmitting aperture 3 and a second light transmitting aperture 4. The aperture 3 is of such a shape as to illuminate a single VHF channel representing indicia while the aperture 4 is elongated to illuminate a wider range of the associated UHF indicia. The overlay 2 is also provided with apertures 5 and 6 which provide communication between the outside of the cabinet and the VHF and UHF tuning shafts and associated sleeves respectively.

The VHF tuning controls comprise a VHF channel selector shaft 7 surrounded by a concentric VHF fine tuning sleeve 8, the shaft 7 and the sleeve 8 being operably connected in conventional fashion to the VHF tuner positioned within the cabinet.

The UHF tuning control comprises a UHF tuning shaft 9 surrounded by a concentric sleeve 10 which is driven at a planetary speed with respect to the shaft 9, the shaft 9 and the sleeve 10 being operably connected in conventional fashion to a UHF converter positioned within the cabinet.

Figure 2:
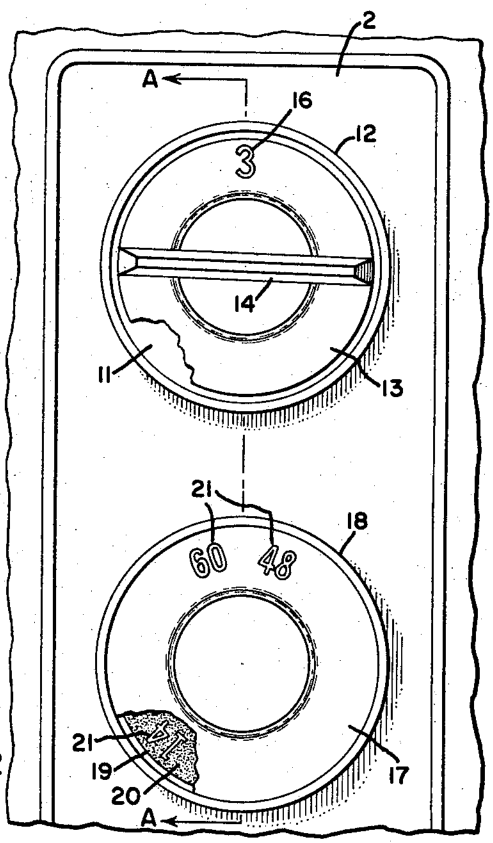
FIGURE 2 is a partial front view similar to FIGURE 1 showing the UHF and VHF tuning controls in place, the controls being partially broken away for illustration purposes.
Figure 3:
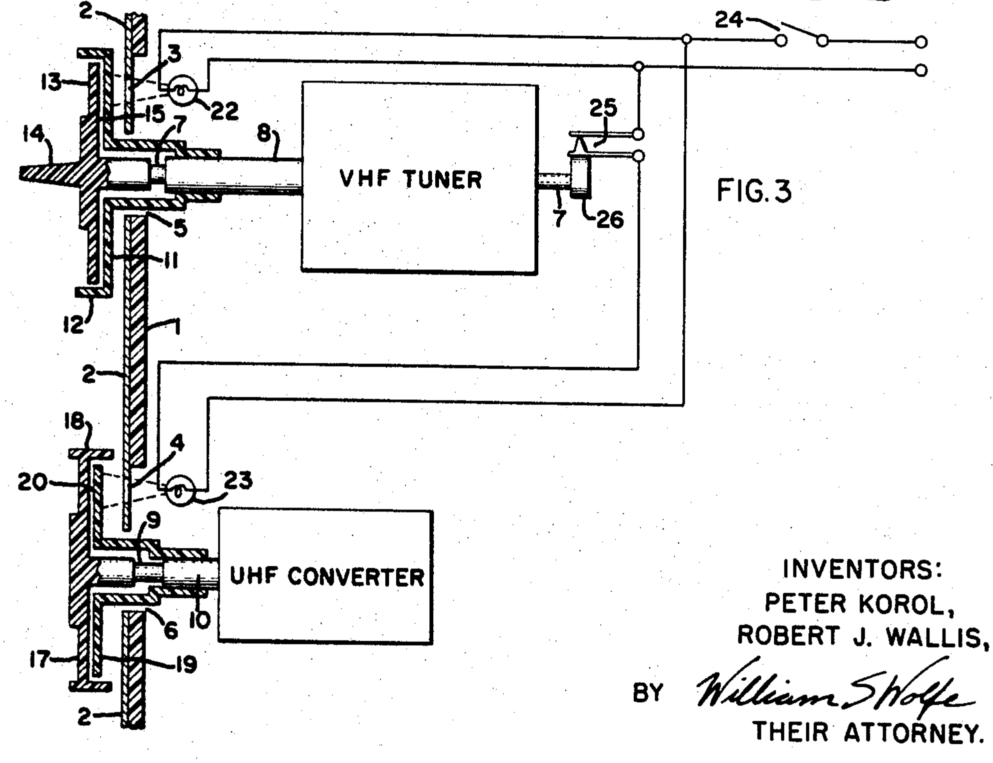
FIGURE 3 is a sectional view taken along the line A—A in FIGURE 2.

Referring now to FIGURE 2, there is shown the VHF and UHF tuning controls positioned on the associated shafts and sleeves as depicted more clearly in FIGURE 3. The VHF tuning controls comprise a generally disc shaped member 11 including an outwardly extending flange portion 12. The disc shaped member 11 is affixed to the VHF fine tuning sleeve 8 for rotation therewith to allow manual fine tuning of the VHF tuner in accordance with known techniques. A second generally disc shaped member 13 is affixed to the VHF channel selector shaft 7 and rotated therewith to allow selection of the desired VHF channel. The generally disc shaped member 13 is nested within the enclosure defined by the flange 12 and is provided with a outwardly extending knob portion 14 to allow the channel selector shaft 7 to be easily manipulated.

In accordance with the invention, the generally disc shaped member 11 is formed from a translucent material while the generally disc shaped member 13 is formed from a transparent material, the rear surface 15 of the member 13 being provided with transparent channel representing indicia 16 against an opaque background.

In a preferred embodiment of the invention, the member 11 is formed from a translucent milky-white plastic material such as acrylonitrile styrene of the desired color and the member 13 is formed from a transparent blue-gray plastic material of a similar composition, the rear surface 15 of the member 13 being silk-screened to provide transparent indicia against an opaque background.

The UHF tuning controls comprise a generally disc shaped member 17 having an inwardly extending flange portion 18, the member 18 being formed from a transparent material. The disc shaped member 17 is affixed to the UHF tuning shaft 9 for rotation therewith to allow tuning of the UHF converter in accordance with known techniques.

A second generally disc shaped member 19 is positioned behind the member 17, the member 19 being nested within the enclosure defined by the flange portion 18 of the member 17. The disc shaped member 19 is attached to the UHF tuning sleeve 10 and thus rotates at a planetary speed with respect to rotation of the disc shaped member 17. The disc shaped member 19 is formed from a translucent material and the front surface 20 is provided with channel representing indicia 21 in such a manner that translucent indicia are presented against an opaque background.

In the preferred embodiment of the invention, the member 19 is formed from the translucent milky-white plastic material from which the member 11 is formed and the disc shaped member 17 is formed from the transparent blue-gray plastic material from which the member 13 is formed. The channel representing indicia 21 are silk-screened on the front surface 20 of the member 19 to provide translucent indicia against an opaque background.

Referring to FIGURE 3, there is shown a sectional view taken along the line A—A of FIGURE 2. As depicted, a lamp 22 is positioned within the receiver cabinet adjacent the light transmitting aperture 3. The lamp 22 serves to direct a light beam through the aperture 3 to illuminate the translucent disc shaped member 11. In this manner, the translucent member 11 serves as a back-lighted screen for the transparent channel representing indicia 16 on the rear surface 15 of the disc shaped member 13.

Similarly, a lamp 23 is positioned within the cabinet adjacent the aperture 4, the lamp 23 serving to direct a light beam through the aperture 4. The translucent disc shaped member 19 thus provides a back-lighted screen for the channel representing indicia 21 on the front surface 20 of the member 19. The channel representing indicia 21 are viewed through the transparent disc shaped member 17.

The translucent back-lighted screens provided by the members 11 and 19 produce pleasing and easily viewed channel indications. More specifically, through the use of back-lighted translucent screens in this manner, the channel representing indicia appear to be "floating" in space. Further, through the use of the arrangement disclosed, the channel representing indicia are essentially invisible when the associated lamps are unenergized.

In accordance with another feature of the invention, the lamp 22, which illuminates the VHF channel representing indicia 16, is energized at all times during receiver operation by the action of the On-Off switch 24. However, the lamp 23 is only energized when the VHF tuning shaft is in the UHF position. The lamp 23 is energized by the action of the switch 25 which is operated by a cam surface 26 on the UHF tuning shaft 7, the switch 25 only being closed when the VHF channel selector shaft 7 is in the UHF position. It will be appreciated that equivalent switching means to the cam arrangement depicted might be utilized such as for example a wafer switch operably connected to the shaft 7.

In accordance with an important object of the invention, the indicating device of the present invention is easily interchangeable with a non-illuminated device since no additional structural elements are required. Thus, if non-illuminated operation is desired, the lamps 22 and 23 and the switch 25 are merely eliminated while UHF and VHF tuning controls of identical shape to those of disc shaped members 11, 13, 17 and 19 are utilized.

Although the invention has been described with respect to certain specific embodiments, it will be appreciated that modifications and changes may be made by those skilled in the art without departing from the spirit and scope of the invention.

What is claimed as new and desired to be secured by Letters Patent of the United States is:

1. A UHF and VHF channel selector and indicator apparatus for a television receiver, said apparatus comprising;

(A) a VHF tuner including a VHF channel selector shaft and a VHF fine tuning sleeve surrounding said VHF selector shaft, (B) a UHF converter including a UHF tuning shaft and a sleeve surrounding and coupled to said UHF tuning shaft, (C) a front panel for the television receiver including inner and outer surfaces and having first and second light transmitting apertures and first and second shaft receiving apertures therein, said VHF channel selector shaft extending through the first shaft receiving aperture and said UHF tuning shaft extending through the second shaft receiving aperture, (D) a VHF channel selector disc positioned on said VHF selector shaft, a said VHF channel selector disc including transparent indicia on a substantially opaque packground.

(E) a VHF fine tuning disc interposed between said VHF tuner and said VHF channel selector disc and affixed to said VHF fine tuning sleeve, said VHF fine turning disc being formed from a translucent material, (F) a UHF tuning disc affixed to said UHF tuning shaft, said UHF tuning disc being formed from a transparent material, (G) a UHF indicator disc interposed between said UHF tuning disc and said UHF converter and affixed to the sleeve surrounding said UHF tuning shaft, said UHF indicator disc including translucent indicia on an opaque background.

(H) a first lamp adjacent the inner surface of said front panel and aligned with the first light transmitting aperture and said VHF channel selector disc so as to selectively illuminate the indicia thereon, a second lamp positioned adjacent the inner surface of said front panel and aligned with the second light transmitting aperture and said UHF indicator disc so as to selectively illuminate the indicia thereon 2. A UHF and VHF channel selector and indicator apparatus for a television receiver, said apparatus comprising;

(A) a VHF tuner including a VHF channel selector shaft and a VHF fine tuning sleeve surrounding said VHF selector shaft, (B) a UHF converter including a UHF tuning shaft and a sleeve surrounding and coupled to said shaft, (C) a front panel for the television receiver including inner and outer surfaces and having first and second light transmitting apertures and first and second shaft receiving apertures therein, said VHF channel selector shaft extending through the first shaft receiving aperture and said UHF tuning shaft extending through the second shaft receiving aperture, (D) a VHF channel selector disc affixed to said UHF selector shaft, said VHF channel selector disc including transparent indicia on a substantially opaque background, (E) a VHF fine tuning disc interposed between said VHF tuner and said VHF channel selector disc and affixed to said VHF fine tuning sleeve, said VHF fine tuning disc being formed from a translucent material and having a flange portion of a greater diameter than the diameter of said VHF channel selector disc, (F) a UHF tuning disc affixed to said UHF tuning shaft, said UHF tuning disc being formed from a transparent material and including a flanged portion, (G) a UHF indicator disc interposed between said UHF tuning disc and said UHF converter and affixed to the sleeve surrounding said UHF tuning shaft, said UHF indicator disc having a diameter less than that of said UHF tuning disc and including translucent indicia on an opaque background, (H) a first lamp adjacent the inner surface of said front panel and aligned with the first light transmitting aperture and said VHF channel selector disc so as to selectively illuminate the indicia thereon, a second lamp positioned adjacent the inner surface of said front panel and aligned with the second light transmitting aperture and said UHF indicator disc so as to selectively illuminate the indicia thereon, (I) means for energizing said first lamp when said receiver is in operation, and (J) switch means coupled to said VHF selector shaft for energizing said second lamp only when said VHF channel selector switch is in the UHF position.

3. A UHF and VHF channel selector and indicator apparatus for a television receiver, said apparatus comprising;

(A) a VHF tuner including a VHF channel selector shaft and a VHF fine tuning sleeve surrounding said VHF selector shaft, (B) a UHF converter including a UHF tuning shaft and a sleeve surrounding and coupled to said UHF tuning shaft, (C) a front panel for the television receiver including inner and outer surfaces and having first and second light beam defining apertures therein and first and second shaft receiving apertures therein, said VHF channel selector shaft extending through the first shaft receiving aperture and said UHF tuning shaft extending through the second shaft receiving aperture, (D) a VHF channel selector disc positioned on said VHF selector shaft, said VHF channel selector disc including transparent indicia on a substantially opaque background, (E) a VHF fine tuning disc interposed between said outer surface of said front panel and said VHF channel selector disc and affixed to said VHF fine tuning sleeve, said VHF fine tuning disc being formed from a translucent material and having a flange portion of a greater diameter than the diameter of said VHF channel selector disc, (F) a UHF tuning disc affixed to said UHF tuning shaft, said UHF tuning disc being formed from a transparent material and including a flanged portion, (G) a UHF indicator disc interposed between said UHF tuning disc and said outer surface of said front panel and affixed to the sleeve surrounding said UHF tuning shaft, said UHF indicator disc having a diameter less than that of said UHF tuning disc and including translucent indicia on a substantially opaque background, (H) a first lamp adjacent the inner surface of said front panel and aligned with the first light transmitting aperture and said VHF channel selector disc so as to selectively illuminate the indicia thereon, a second lamp positioned adjacent the inner surface of said front panel and aligned with the second light transmitting aperture and said UHF indicator disc so as to selectively illuminate the indicia thereon, (I) means for energizing said first lamp when said receiver is in operation, and (J) switch means coupled to said VHF channel selector shaft for energizing said second lamp only when said VHF channel selector switch is in the UHF position.

4. The apparatus defined in claim 3 wherein said VHF channel selector disc further comprises a substantially transparent material with the substantially opaque background formed on a surface thereof, and said UHF indicator disc further comprises a substantially translucent material with the substantially opaque background formed on a surface thereof.

References Cited

UNITED STATES PATENTS

| | | | |
|---|---|---|---|
| 2,665,377 | 1/1954 | Krepps. | |
| 2,711,711 | 6/1955 | Harman | 116—124.4 |
| 2,824,957 | 2/1958 | Meadows et al. | 74—10.45 XR |
| 2,989,627 | 6/1961 | Silvey. | |
| 3,152,487 | 10/1964 | Kennedy | 74—10.41 |
| 3,240,182 | 3/1966 | Kemeny | 116—124.4 |
| 3,251,234 | 5/1966 | Valdettaro | 74—10.6 |

LOUIS J. CAPOZI, *Primary Examiner.*

U.S. Cl. X.R.

74—10.45; 334—86